United States Patent
Raijmakers et al.

(10) Patent No.: US 6,567,133 B2
(45) Date of Patent: May 20, 2003

(54) METHOD AND APPARATUS FOR SELECTING AN OPTION IN A SYSTEM

(75) Inventors: Jozef H. M. Raijmakers, Eindhoven (NL); Michiel A. Cornelissen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/325,672

(22) Filed: Jun. 3, 1999

(65) Prior Publication Data

US 2002/0101455 A1 Aug. 1, 2002

(30) Foreign Application Priority Data

Nov. 3, 1998  (EP) .............................................. 98203711

(51) Int. Cl.[7] .................................................. H04N 5/44
(52) U.S. Cl. ........................ 348/734; 700/84; 340/14.3
(58) Field of Search ................................. 348/334, 569, 348/564; 340/825.03, 14.3; 700/181, 183, 83, 84; 341/22; 345/172

(56) References Cited

U.S. PATENT DOCUMENTS

| | | | | |
|---|---|---|---|---|
| 4,626,848 A | * | 12/1986 | Ehlers .................... | 340/825.69 |
| 5,157,496 A | | 10/1992 | Kurosawa ................. | 358/194.1 |
| 5,355,307 A | | 10/1994 | Scharnhorst ................ | 364/188 |
| 5,835,732 A | * | 11/1998 | Kikinis et al. .............. | 395/281 |
| 5,982,303 A | * | 11/1999 | Smith .......................... | 341/22 |
| 6,198,939 B1 | * | 3/2001 | Holmström et al. ........ | 455/550 |

FOREIGN PATENT DOCUMENTS

| | | | | |
|---|---|---|---|---|
| GB | 4011067 A1 | 10/1990 | ............ | H04Q/9/00 |
| WO | 93141567 | 7/1993 | ............ | H03J/1/00 |

* cited by examiner

*Primary Examiner*—Victor R. Kostak
(74) *Attorney, Agent, or Firm*—John Vodopia

(57) ABSTRACT

An option is selected from a plurality of options by selecting a soft key from a plurality of displayed soft keys, each corresponding with a respective one of the options. The soft keys are displayed as a number of distinguishable groups of soft keys. A user first selects a particular group of soft keys. Then the soft keys are related to the hard keys of an input device on the basis of the relation of the soft key to its group and of the hard key to the input device respectively. Pressing a particular hard key results in the selection of the thus related soft key. The number of hard keys is equal to the number of soft keys in a group, rather than equal to the total number of soft keys.

10 Claims, 2 Drawing Sheets

METHOD AND APPARATUS FOR SELECTING AN OPTION IN A SYSTEM

BACKGROUND OF THE INVENTION

1. Field of the Invention

The invention relates to a method for selecting an option from a plurality of options in a system comprising a display screen and an input device with a plurality of hard keys, the method comprising a display step displaying on the display screen a plurality of soft keys each corresponding with a respective one of the options, the soft keys being displayed in an overall arrangement, a selection step selecting a particular hard key for selecting the soft key that relates with the selected hard key on the basis of correspondence between the soft key in the overall arrangement and the hard key on the input device, and an activation step activating the option corresponding with the thus selected soft key.

The invention further relates to an apparatus for selecting an option from a plurality of options, the apparatus comprising an input device with a plurality of hard keys, a display unit for displaying on a display screen a plurality of soft keys each corresponding with a respective one of the options, the soft keys being displayed in an overall arrangement, a selection unit for upon detection of selection of a particular hard key selecting the soft key that relates with the selected hard key on the basis of correspondence between the soft key in the overall arrangement and the hard key on the input device, and an activation unit for activating the option corresponding with the thus selected soft key.

2. Description of Related Art

A method and an apparatus as described above is known from U.S. Pat. No. 5,157,496. The known apparatus is employed in a television receiver of which the channel to be viewed can be selected by means of a remote controller as input device. In a channel allocation operation, it is determined which channels can be currently received by the television receiver. The channel numbers of these channels are displayed on the screen in a display matrix of 3 rows and 4 columns. The remote controller has 12 keys arranged in a similar key matrix of 3 rows and 4 columns. Pressing a certain key in the key matrix results in the selection of the channel displayed at the corresponding position in the display matrix. In the known apparatus, each option that can be selected, in this case each channel, has its own corresponding key on the input device. Therefore, a large number of options from which an option can be selected requires an equally large number of keys on the input device.

SUMMARY OF THE INVENTION

It is an object of the invention to provide a method of the kind set forth in which the input device has a comparatively smaller number of keys than in the known method. This object is achieved according to the invention in a method which is characterised in that the overall arrangement comprises a plurality of groups each being relatable to the input device, that the method comprises a pre-selection step selecting a particular group thus relating the selected group to the input device, and that in the selection step selecting the particular hard key results in selecting the soft key that relates with the selected hard key on the basis of correspondence between the soft key in the selected group and the hard key on the input device. In the pre-selection step, a subset of the total number of selectable options is selected and it is from this subset that subsequently an option can be selected for activation by the system. Therefore, it suffices that the number of hard keys on the input device is equal to the number of options in this subset and it is not necessary that the number of hard keys is equal to the total number of options. The method according to the invention provides a flexible mechanism for selecting an option from a relatively large number of options in a system by means of an input device with a relatively small, fixed number of hard keys. The options are displayed as a number of groups, whereby each group can be related to input device. The groups are displayed in such a way that the user sees all soft keys, thus giving in one glance an overview of all options available. In the pre-selection step, the user first selects the group of options from which an option is to be selected. This group is then related to the input device, whereby each soft key, which corresponds with an option, is assigned to a corresponding hard key on the input device. A subsequent selection of a hard key results in selection and activation of the corresponding option.

In an embodiment of the method according to the invention, giving the elementary soft layout a similar form as the hard layout of the keys on the input device is an easy mechanism to express the relationship between the options in a group and the input device. The similarity of forms provides a simple indication for the user that such a group can be related to the input device.

In an further embodiment of the method according to the invention, the similarity between the position of the soft key in the group and the position of the hard key on the input device provides a simple indication for the user that the particular soft key can be selected by selecting the corresponding hard key. This allows the user to keep looking at the display screen, on which the soft keys are displayed, while making a selection among the hard keys of the input device. The correspondence between the position of the soft key in the group and the hard key on the input device insure that there is no need to look away from the display screen to the input device in order to make a selection.

In a further embodiment of the method according to the invention a direct key provides a quick access to the corresponding option, since it is not necessary to make a pre-selection of a group of options. This feature can advantageously be used for options that are present in every mode of the system and for options that must allow quick access.

In a further embodiment of the method according to the invention, the display of and subsequent selection from is from a set of options that is assembled in dependence on the current state of the system. In this way, the user is given a choice from options that are specifically relevant for the current context of the user's operation of the system.

It is a further object of the invention to provide an apparatus of the kind set forth in which the input device has a comparatively smaller number of keys than in the known apparatus. This object is achieved according to the invention in an apparatus which is characterised in that the display unit is arranged to display the overall arrangement as comprising a plurality of groups each being relatable to the input device, that the apparatus comprises a pre-selection unit for selecting a particular group thus relating the selected group to the input device, and that the selection unit is arranged for upon detection of selection of the particular hard key selecting the soft key that relates with the selected hard key on the basis of correspondence between the soft key in the selected group and the hard key on the input device. Because the pre-selection unit allows the user to make a selection of a group among the groups of displayed soft keys, the actual selection of a soft key for activation of the desired option is to be made from such a group. Therefore it suffices that the input device has a hard key for each of the soft key of the group and it is no longer necessary for the input device to have a hard key for each of the displayed options. The apparatus according to the invention still provides the user with full access to all of the displayed options with a smaller number of hard keys. The actual display of the selectable options and the mapping of the soft keys to the hard keys of the input device may be realised in software. This gives a large flexibility in that a given input device can be used in conjunction with different soft keys and corresponding functions.

BRIEF DESCRIPTION OF THE DRAWINGS

The invention and its attendant advantages will be further elucidated with the aid of exemplary embodiments and the accompanying schematic drawings, wherein.

Corresponding features in the various Figures are denoted by the same reference symbols.

DETAILED DESCRIPTION OF THE PREFERRED EMBODIMENT

Figure 1:
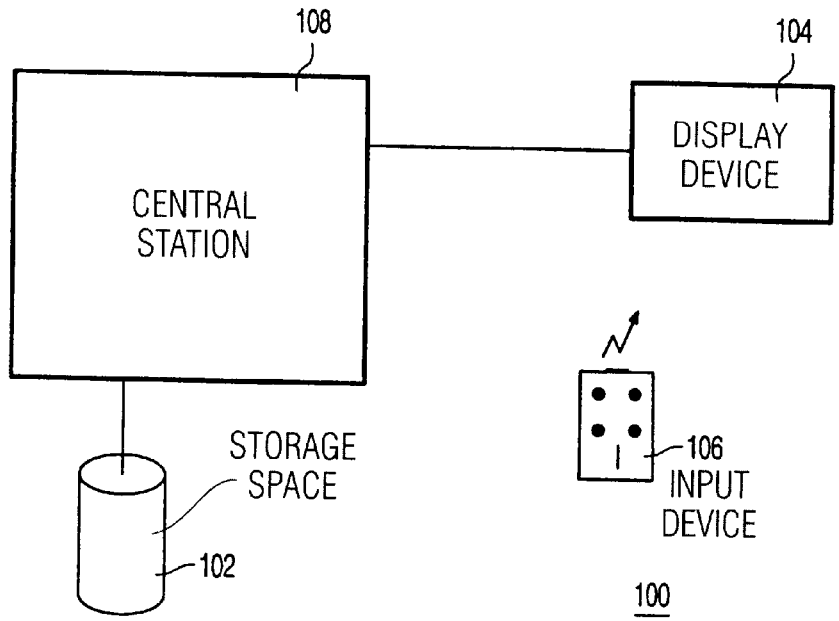
FIG. 1 shows an overview of a system employing the invention.

FIG. 1 shows an overview of a system employing the invention. This system 100 is an X-ray viewing system operated by a user. The system 100 has a storage space 102 comprising X-ray images of one or more patients. A user can control the system to retrieve one or more images from the storage space and to display these images on a display device 104. To this end, the system has an input device 106 with which the user can select a desired function of the system. The input device 106 sends commands to the system in a wireless way via infrared signals providing a large operational flexibility to the user. The type of connection between the input device and the system is not relevant to the invention. Another type of wireless link than infrared signals can be used or the link may be via a cable. The system has a central station 108 based on a general purpose computer to carry out the various tasks of the system.

Figure 2:
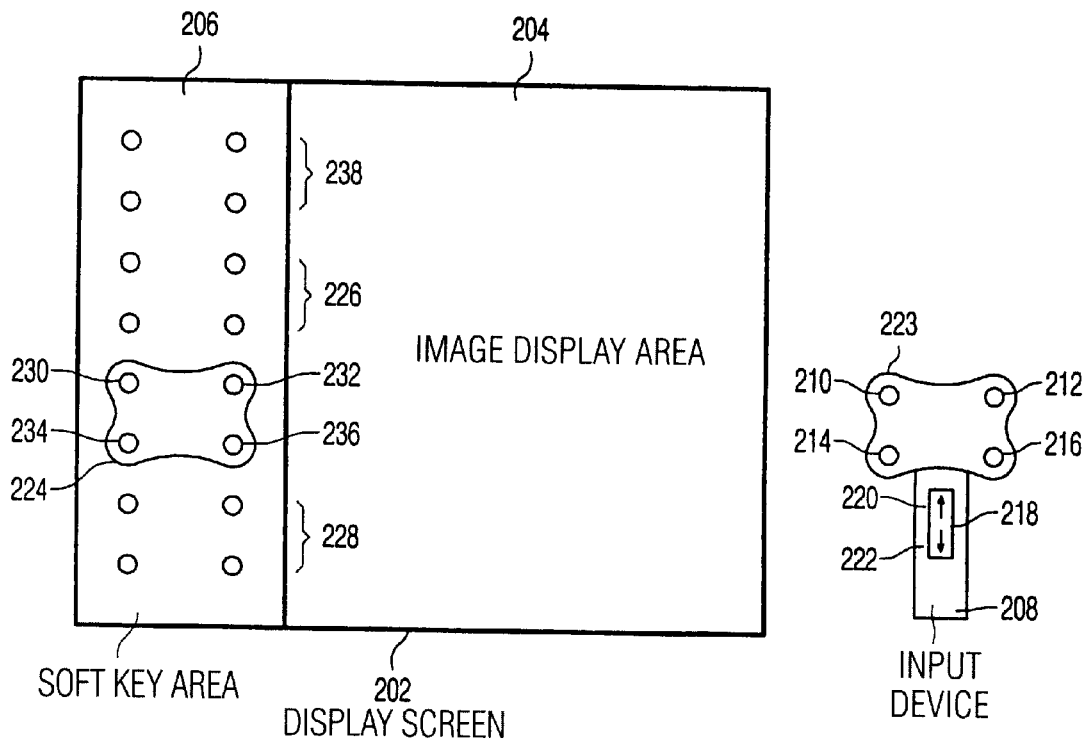
FIG. 2 shows the display screen on the display device and the input device.

FIG. 2 shows the display screen on the display device and the input device. The display screen 202 has an image display area 204 and a soft key area 206. The image display area is used to display the image chosen by the user. In the soft key area, the system displays soft keys for the user to select a function of the system. Each soft key corresponds with a certain function and selection of a soft key results in the activation of that function. A soft key is provided with a pictogram to assist the user in memorising the corresponding function of the soft key. The actual contents of the pictograms are not relevant to the invention and therefore they are not shown in the drawings for reasons of clarity. The input device 208 has 4 hard keys, these are keys 210, 212, 214 and 216, and a push-button 218 that can be pushed at two different positions 220 and 222. Pressing a hard key of the input device results in the selection of the soft key which is currently related to that hard key. How this relation is established is explained below.

The soft keys are displayed in a certain overall arrangement that is composed of 4 groups of 4 keys each. Such a group and its soft keys are displayed in a layout that corresponds with the layout of the hard keys on the input device. At any one time, only one of the groups is active allowing the soft keys of that group to be selected. This is indicated on the display screen by highlighting an area, like area 224, forming the layout of that active group. The user can select which of the groups is to be active by manipulating push-button 218 of the input device. Pushing on position 220 makes that the next group up becomes the active group, i.e. group 226, and pushing on position 222 makes that the next group down becomes the active group, i.e. group 228. The soft keys of the active groups are related to the hard keys of the input device. This relationship is by correspondence in position: the soft key on a given position in the layout of the selected group, e.g. in layout 224, is related to the hard key that has the same position in the layout of keys on the input device. In the example where the selected group has the indicated layout 224, soft key 230 is related to hard key 210, soft key 232 to hard key 212, soft key 234 to hard key 214, and soft key 236 to hard key 216. Pressing a hard key on the input device results in selecting the related soft key and activation of the corresponding function.

Selecting a certain soft key according to the invention is done in two steps. First, the user selects the group in which the soft key is located by manipulating push-button 218. Secondly, the user pushes the hard key that corresponds in position with the desired soft key in the selected group. If the user wants to select a soft key in the group which is already active, then the first step can be skipped and the hard key can be pushed directly. When a hard key is being pushed, the input device transmits a signal which is indicative of that particular hard key. In the embodiment shown in FIG. 2, the input device is capable of transmitting 6 different signals: 4 signals for the respective hard keys, 1 signal when pushed at position 220 for moving the active group up, and 1 signal when pushed at position 222 for moving the active group down. The signals are received in the central station and translated to the intended action for the system. When a hard key is pressed, then a table is accessed to determine which soft key is to be selected on the basis of which of the groups is active and which of the 4 keys is being pressed.

In the embodiment shown in FIG. 2, the overall arrangement of the soft keys is composed of different groups arranged along a single axis. The groups are arranged on top of each other from the bottom of the display screen to the top of the display screen. To select a group, it suffices to have a button that controls the movement of the indication area 224 along this single axis in its two directions up and down. Instead of using a single axis, the groups can be arranged along two different axes. This requires a button on the input device allowing a 2-dimensional movement of the indication area in the soft key area 206. This can be a push-button with 4 different push positions or a joystick which can move in the two different directions along the two axes.

In another embodiment, the input device may have the keys arranged in three dimensions, e.g. 4 keys at respective sides of a cubic shaped body. Then a group of keys is displayed as the keys on a three dimensional representation of the input device in the soft key area of the display screen.

Furthermore, in the embodiment of FIG. 2, the 16 soft keys are treated as 4 different groups of 4 keys with no overlap of keys between groups. However, it is also possible to define the groups in such a way that a subsequent group has a number of keys in common with a previous group. In FIG. 2, this can be realised by moving the indication area 224 by only 1 row of soft keys instead of the two rows as described above.

In the embodiment of FIG. 2, the 4 groups of soft keys are displayed at fixed positions on the display screen and the indication area 224 is moved relative to these positions for making a selection among the groups. However, it would also be possible to have the indication area at a fixed position on the display screen and to move the groups relative to this position. This is carried out in a cyclic manner, whereby a group which moves from the screen is being entered again at the opposite side. When for instance in the example drawn in FIG. 2, the groups are moved 1 position upwards the following events occur. Group 228 moves into the indication area and becomes the new active group from which a soft key can be selected. The previous active group moves to the previous position of group 226 and group 226 moves to the previous position of group 238. Furthermore, group 238 moves at the upper side out of the soft key area and is entered again at the bottom side of the soft key area, then taking the previous position of group 228.

Below is given the allocation of functions to soft keys in the system using the invention as shown in FIG. 2. In this system, a file contains a number of images of a patient and a run is a series of images that together form the result of an examination, e.g. a series of images taken 1 second apart or a series of images taken at 5 centimeters distance apart. The 4 soft keys of the first group all start with the letter 'a', the soft keys of the second group with the letter 'b', the soft keys of the third group with the letter 'c', and the soft keys of the fourth group with the letter 'd'. The first group is indicated by reference numeral 238. The second group is indicated by reference numeral 226, the third group is active as shown by indication area 234, and the fourth group is indicated by reference numeral 228. In a group, the top left soft key has number '1', the top right soft key has number '2', the bottom left soft key has number '3', and the bottom right soft key has number '4'. According to this terminology and the example of FIG. 2, soft key 'c1' has reference numeral 230, soft key 'c2' has reference numeral 232, soft key 'c3' has reference numeral 234, and soft key 'c4' has reference numeral 236. The functions of the soft keys in the X-ray image viewing system are, in one of its operational modes, according to the following table.

| | |
|---|---|
| a1 | next image |
| a2 | previous image |
| a3 | next run |
| a4 | previous run |
| b1 | overview of images in selected file |
| b2 | overview of images in selected run |
| b3 | select file |
| b4 | delete run |
| c1 | play run |
| c2 | zoom from centre with factor 2 |
| c3 | play run slow and hold when released |
| c4 | play run fast and hold when released |
| d1 | subtract two images |
| d2 | print with default settings |
| d3 | subtraction result as mask |
| d4 | invert image |

The actual display of soft keys in the soft key area and the assignment of system functions to those keys is dependent on the actual mode of the system. In this way, the user is presented with a set of selectable functions that is particularly relevant in the particular mode. An example is that the set of the displayed soft keys and assigned functions depends on the nature of the examination for which the X-ray images have been made. For the purpose of displaying X-ray images taken as part of the examination of a heart and its arteries, a different set of functions is available than for displaying X-ray image taken from the bones of a limb. So depending on the nature of the examination, a specific set of soft keys and functions is presented to the user.

Figure 3:
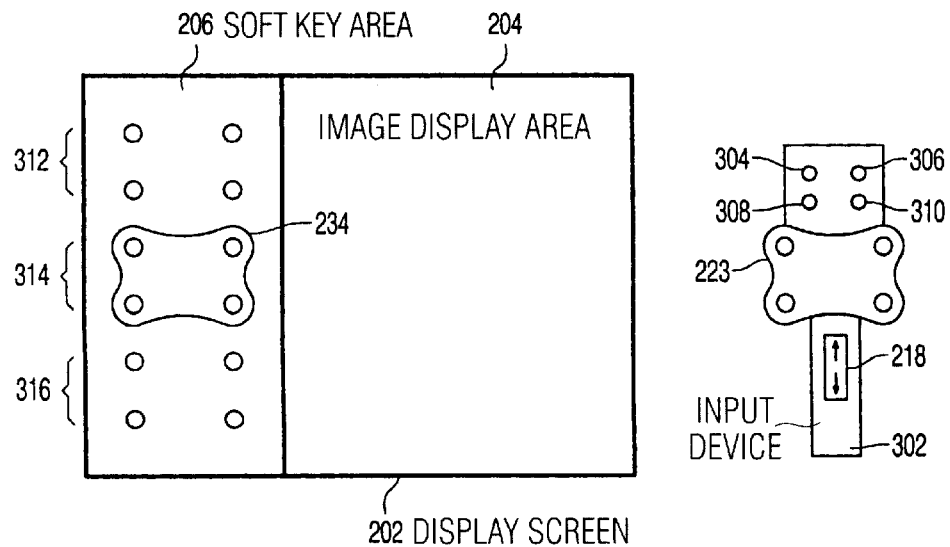
FIG. 3 shows an alternative display screen and input device.

FIG. 3 shows an alternative display screen and input device. In the same way as described above in connection with FIG. 2, the input device 302 has 4 hard keys in a hard layout 223 which are related to a group of 4 soft keys shown in display area 206. The hard keys can for instance be related to the group of keys indicated by area 234. In addition to these 4 hard keys, the input device 302 has 4 direct keys, namely key 304, 306, 308 and 310 respectively. Each direct key has a corresponding function of the system assigned to it. Pressing a direct key causes the selection and subsequent activation of that function, irrespective of which of the groups of displayed soft keys is active. This gives the advantage that for the activation of such a system function no pre-selection needs to be done. This saves time and is therefore particularly useful for functions that are used very frequently or must be available with as little delay as possible.

Application of this alternative input device to the system shown in FIG. 2 results in the allocation of function to direct keys and soft keys described below. The soft keys of group 312 start with an 'a', the soft keys of group 314 start with a 'b', and the soft keys of group 316 start with a 'c'. The numbering of soft keys inside a group is the same as above. The functions of the direct keys and of soft keys in this alternative embodiment of the X-ray image viewing system are, in one of its operational modes, according to the following table.

| | |
|---|---|
| direct key 304 | next image |
| direct key 306 | previous image |
| direct key 308 | next run |
| direct key 310 | previous run |
| soft key a1 | overview of images in selected file |
| soft key a2 | overview of images in selected run |
| soft key a3 | select file |
| soft key a4 | delete run |
| soft key b1 | play run |
| soft key b2 | zoom from centre with factor 2 |
| soft key b3 | play run slow and hold when released |
| soft key b4 | play run fast and hold when released |
| soft key c1 | subtract two images |
| soft key c2 | print with default settings |
| soft key c3 | subtraction result as mask |
| soft key c4 | invert image |

Figure 4:
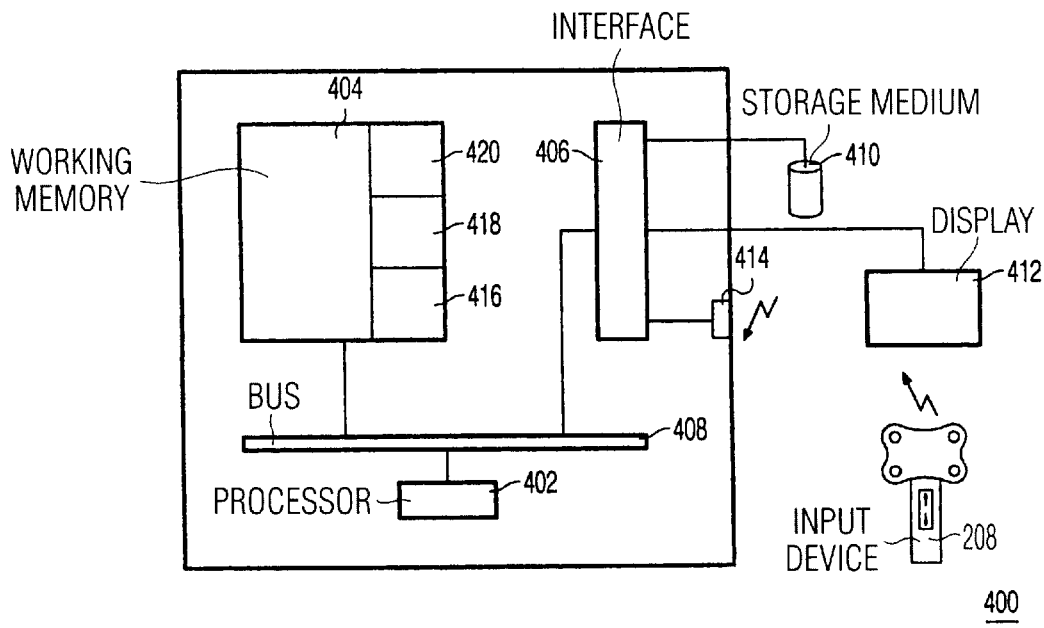
FIG. 4 shows an apparatus for selecting an option according to the invention.

FIG. 4 shows an apparatus for selecting an option according to the invention. The apparatus 400 is implemented according to a known architecture and is realised on a general purpose computer. The apparatus has a processor 402 for carrying out instructions of the program units loaded into working memory 404. The apparatus further has an interface 406 for communication with peripheral devices. There is a bus 408 for the exchange of commands and data between the various components of the apparatus. The peripheral devices of the apparatus include a storage medium 410 containing the executable program units. The storage medium 410 can be realised as various separate devices, potentially of different kind of storage device. Application of the invention is not restricted by the type of storage device. Types of storage device that can be used include magnetic disc, optical disc, tape, chip card, solid state or some combination of these types. The peripheral devices of the apparatus further include a display 412 on which the apparatus displays a display screen with soft keys.

Furthermore, the apparatus is equipped with an infrared receiver 414 for receiving the signals transmitted by the input device 208. In order to carry out the various tasks, the respective program units are loaded into working memory 404. There is a display unit 416 for displaying on the display screen of display device 414 a plurality of soft keys each corresponding with a respective one of the functions that can be selected. There is also a selection unit 418 for upon detection of selection of a particular hard key of the input device 208 selecting the soft key that relates with the selected hard key on the basis of correspondence between the soft key and the hard key. Furthermore, there is an activation unit 420 for activating the function corresponding with the thus selected soft key.

When the apparatus 400 is used in a system, like in the X-ray viewing system described above, the apparatus may be integrated with other parts of such a system into one overall system. This means that other program units, for carrying out the various functions of the system, will also be loaded in the working memory 404. Furthermore, storage medium 410 will then be used for storing these other program units and other data, like the X-ray images of the viewing system. Also other devices may be included in such an overall system, like a keyboard for entry of textual data.

All references cited herein are incorporated herein by reference in their entirety and for all purposes to the same extent as if each individual publication or patent or patent application was specifically and individually indicated to be incorporated by reference in its entirety for all purposes.

What is claimed is:

1. A method for selecting an option from a plurality of options in a system comprising a display screen and an input device having a plurality of hard keys, the method comprising:

a display step for simultaneously displaying on the display screen each and every one of a plurality of soft keys, each of which corresponding to a respective one of the plurality of options, the plurality of soft keys having associated therewith a plurality of groups of soft keys, each group being relatable to the input device, a preselection step selecting a particular group of the plurality of groups of soft keys, a selection step selecting a particular hard key for selecting a desired soft key of the particular group, the desired soft key relating to the selected hard key on the basis of correspondence between the desired soft key and a location of the hard key on the input device, and an activation step activating the option corresponding with the thus selected soft key, wherein the selection step includes selecting the particular hard key on the basis of correspondence between the soft key in the selected group and the hard key on the input device.

2. A method as claimed in claim 1, wherein the soft keys of respective ones of the plurality of groups are arranged in an elementary soft layout, wherein the hard keys of the input device are arranged in a hard layout, and wherein the particular group is related to the input device on the basis of their respective layouts having a mutually similar form.

3. A method as claimed in claim 1, wherein each soft key of a selected group is related to a corresponding hard key on the basis of the position of the soft key in the selected group and the corresponding position of the hard key on the input device.

4. A method as claimed in claim 1, wherein the input device further comprises a direct key and wherein a particular one of the plurality of options is directly selected by selecting the direct key.

5. A method as claimed in claim 1, wherein the plurality of soft keys are displayed on the basis of a predetermined state of the system.

6. An apparatus for selecting an option from a plurality of options, the apparatus comprising:

an input device with a plurality of hard keys, a display unit for simultaneously displaying on a display screen each and every one of a plurality of soft keys, each of which corresponding with a respective one of the plurality of options, the plurality of soft keys having associated therewith a plurality of groups of soft keys, each being relatable to the input device, a preselection unit for selecting a particular group of the plurality of groups of soft keys, a selection unit for, upon detection of selection of a particular hard key, selecting the soft key which relates to the selected hard key on the basis of correspondence between the desired soft key and a location of the hard key on the input device, and an activation unit for activating the option corresponding with the thus selected soft key.

7. An apparatus as claimed in claim 6, wherein the soft keys of respective ones of the plurality of groups are arranged in an elementary soft layout, wherein the hard keys of the input device are arranged in a hard layout, and wherein the particular group is related to the input device on the basis of their respective layouts having a mutually similar form.

8. An apparatus as claimed in claim 6, wherein each soft key of a selected group is related to a corresponding hard key on the basis of the position of the soft key in the selected group and the position of the corresponding hard key on the input device.

9. An apparatus as claimed in claim 6, wherein the input device further comprises a direct key and wherein the selection unit is arranged to directly select a particular one of the plurality of options upon selection of the direct key.

10. An apparatus as claimed in claim 6, wherein the display unit is arranged to display the plurality of soft keys on the basis of a predetermined state of the system.

* * * * *